(12) United States Patent
Chen et al.

(10) Patent No.: US 8,076,190 B2
(45) Date of Patent: Dec. 13, 2011

(54) SEA-OF-FINS STRUCTURE ON A SEMICONDUCTOR SUBSTRATE AND METHOD OF FABRICATION

(75) Inventors: Howard H. Chen, Yorktown Heights, NY (US); Louis C. Hsu, Fishkill, NY (US); Jack A. Mandelman, Flat Rock, NC (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/535,007

(22) Filed: Aug. 4, 2009

(65) Prior Publication Data

US 2009/0309136 A1 Dec. 17, 2009

Related U.S. Application Data

(62) Division of application No. 11/185,646, filed on Jul. 20, 2005, now abandoned.

(51) Int. Cl.
*H01L 21/336* (2006.01)
*H01L 21/8234* (2006.01)

(52) U.S. Cl. ............... 438/197; 257/E21.442; 257/288; 257/328; 257/618; 257/619; 977/734; 977/742; 977/749; 977/955; 977/815; 438/283; 438/268; 438/279

(58) Field of Classification Search ............... 257/9, 20, 257/76–77, 288, 296, 302, 328–331, 365, 257/368, 613, 618, E21.014, E21.442, E21.618, 257/E21.621, E27.016, E27.112, E29.264, E29.275; 438/197, 268, 279, 283; 977/734, 742, 749, 755, 815, 936, 938
See application file for complete search history.

(56) References Cited

U.S. PATENT DOCUMENTS

| | | | |
|---|---|---|---|
| 6,252,284 B1 | 6/2001 | Muller et al. | |
| 6,762,448 B1 * | 7/2004 | Lin et al. | 257/302 |
| 6,872,647 B1 * | 3/2005 | Yu et al. | 438/585 |
| 6,919,231 B1 | 7/2005 | Ramanathan et al. | |
| 7,297,577 B2 * | 11/2007 | Umebayashi | 438/155 |
| 7,679,134 B1 * | 3/2010 | Buynoski et al. | 257/329 |
| 2003/0193058 A1 * | 10/2003 | Fried et al. | 257/200 |
| 2005/0056888 A1 * | 3/2005 | Youn et al. | 257/331 |
| 2005/0130358 A1 * | 6/2005 | Chidambarrao et al. | 438/197 |
| 2005/0153490 A1 | 7/2005 | Yoon et al. | |
| 2006/0043616 A1 * | 3/2006 | Anderson et al. | 257/900 |

* cited by examiner

*Primary Examiner* — Meiya Li
(74) *Attorney, Agent, or Firm* — Gibb I.P. Law Firm, LLC

(57) ABSTRACT

A semiconductor device and a method of fabricating a semiconductor device is disclosed, the method comprises including: forming etching an oxide layer to form a pattern of parallel oxide bars on a substrate; forming nitride spacers on side walls of the parallel oxide bars, with gaps remaining between adjacent nitride spacers; forming silicon pillars in the gaps; removing the nitride spacers to form a plurality of fin bodies; forming an isolation region in between each of the fin bodies; and coating the plurality of fin bodies, the nitride spacers, and the isolation regions with a protective film.

4 Claims, 10 Drawing Sheets

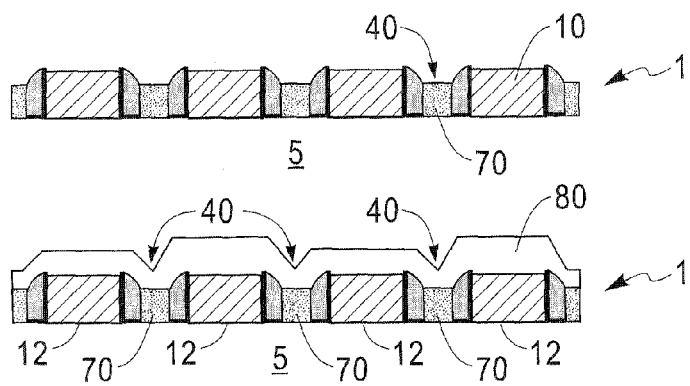
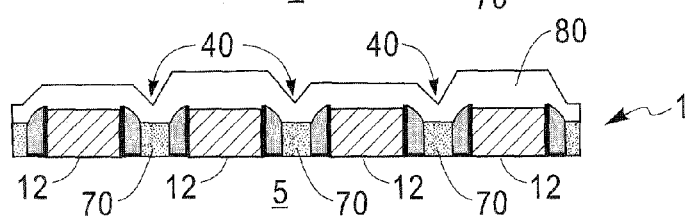
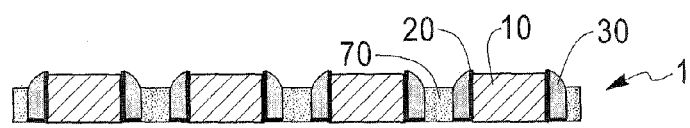
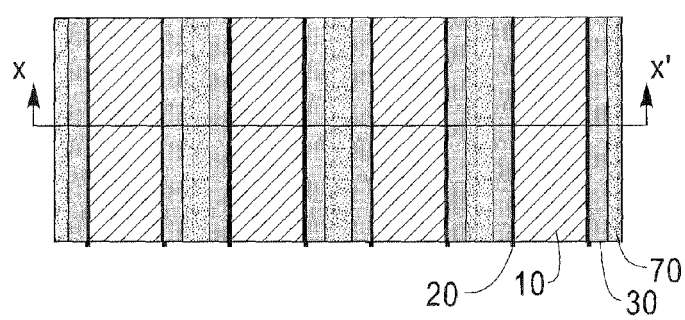
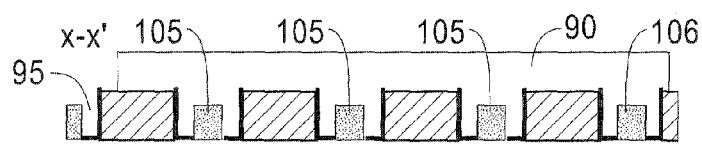
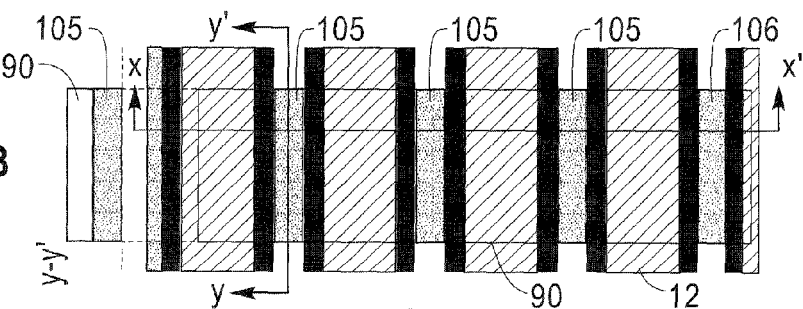

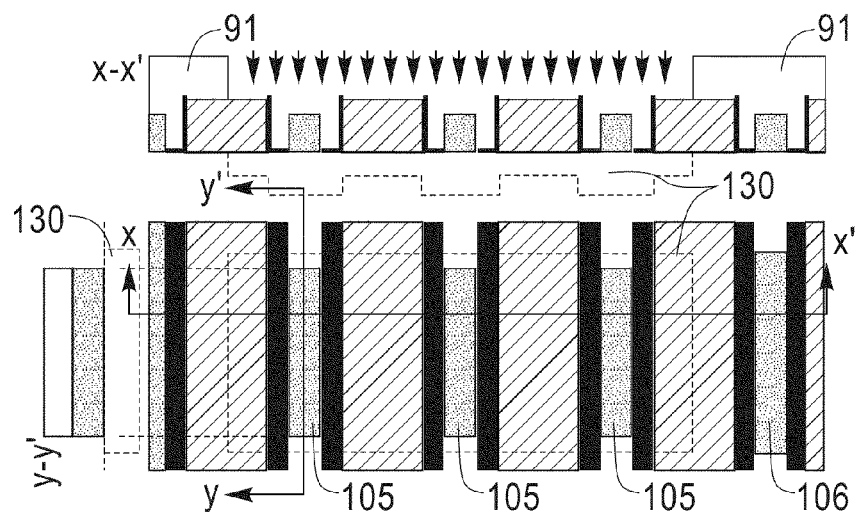
FIG. 6C
FIG. 6B
FIG. 6A
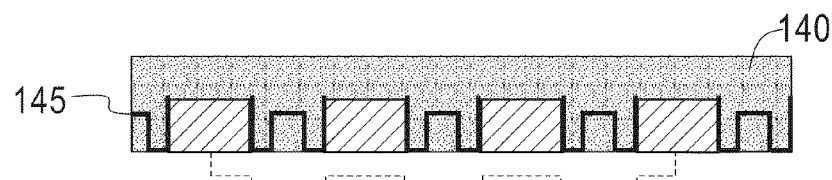
FIG. 7A
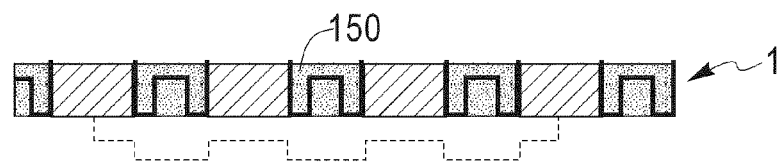
FIG. 7B

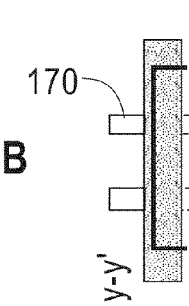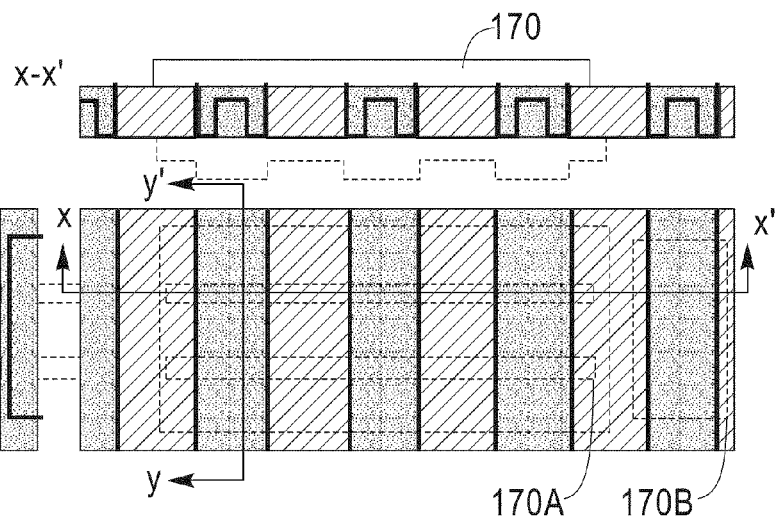
FIG. 8C
FIG. 8B
FIG. 8A
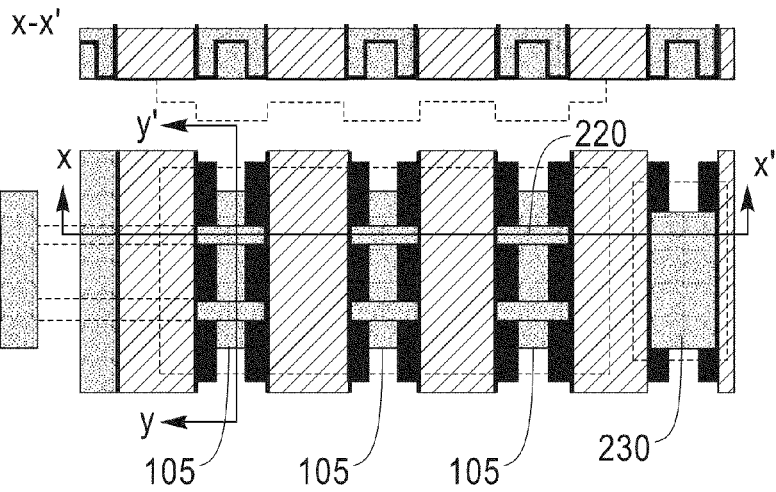
FIG. 9C
FIG. 9B
FIG. 9A

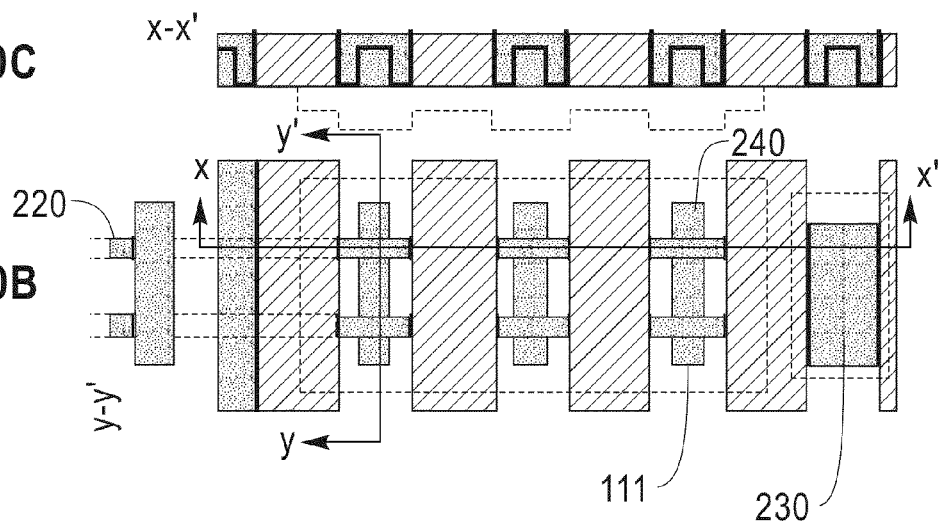
FIG. 10C
FIG. 10B
FIG. 10A
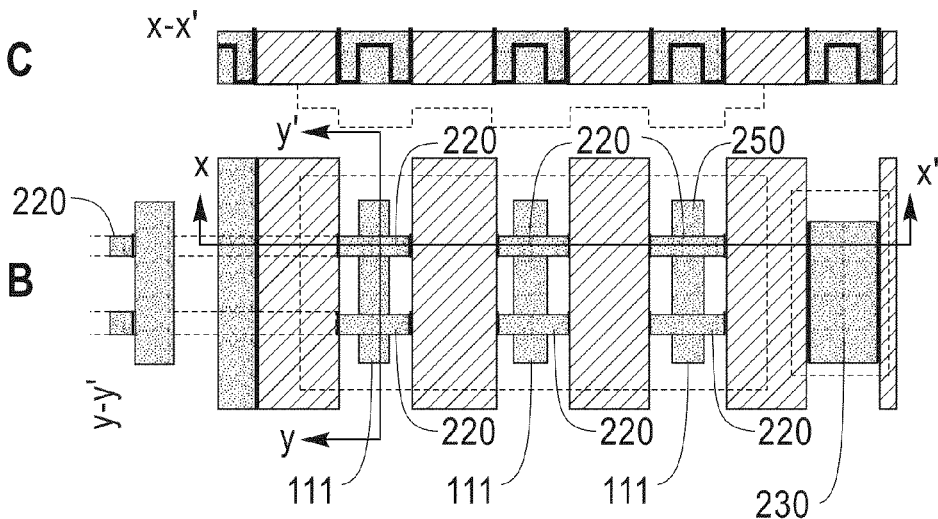
FIG. 11C
FIG. 11B
FIG. 11A

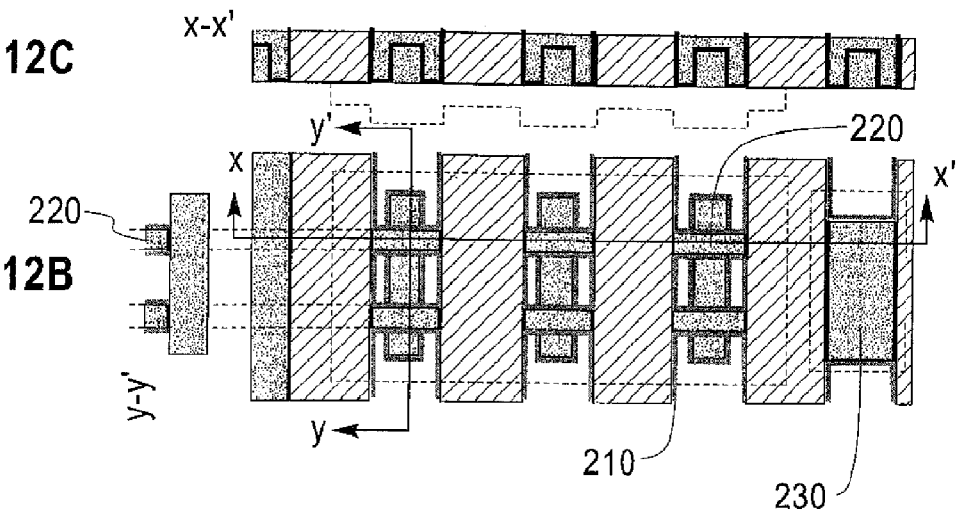
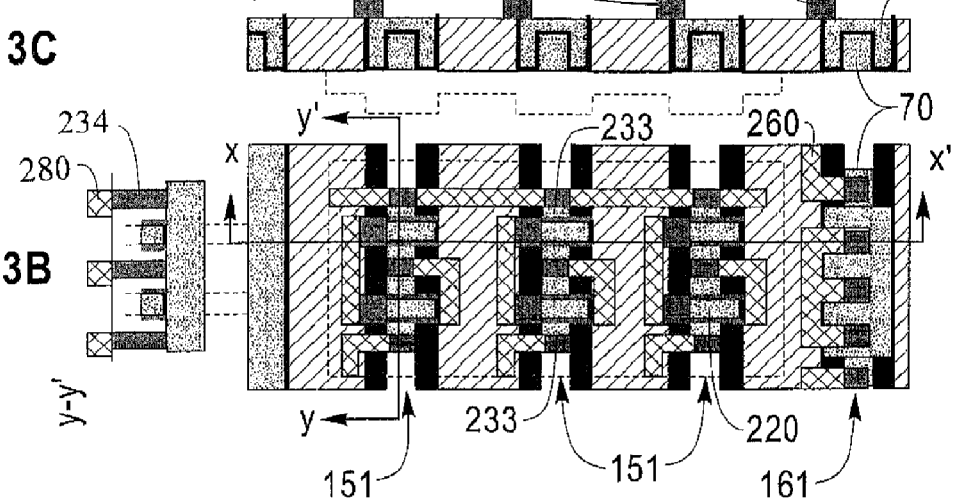

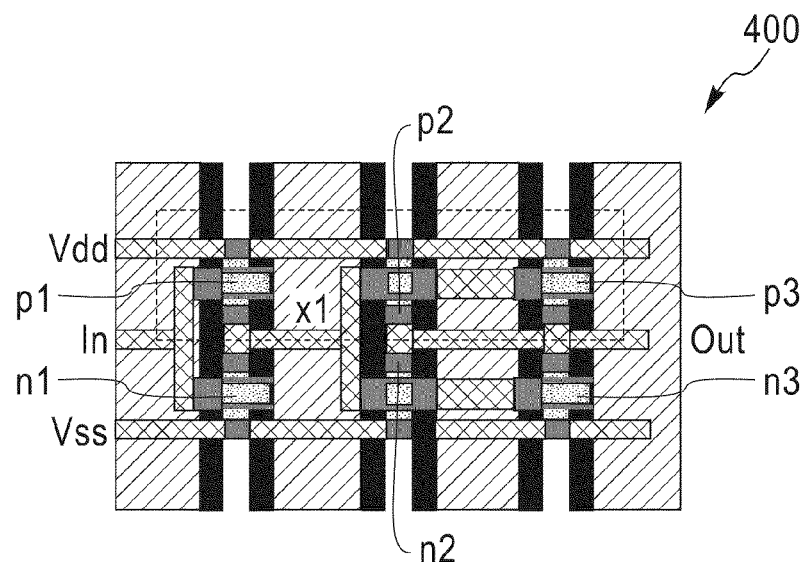
FIG. 14A
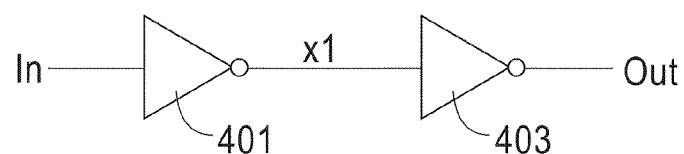
FIG. 14B
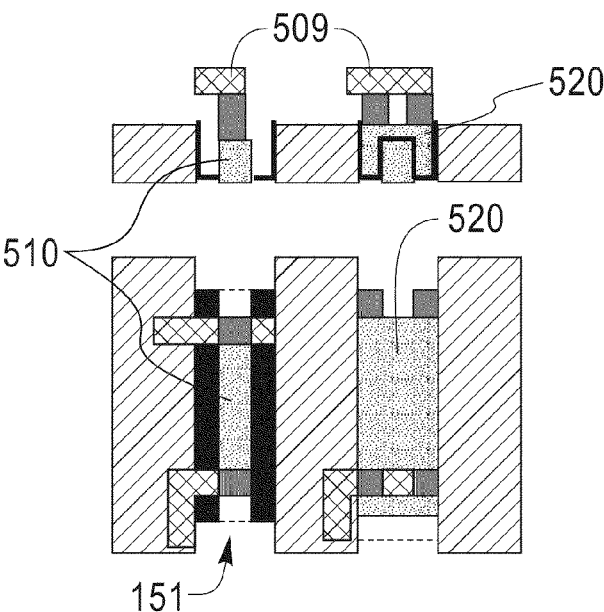
FIG. 15B
FIG. 15A

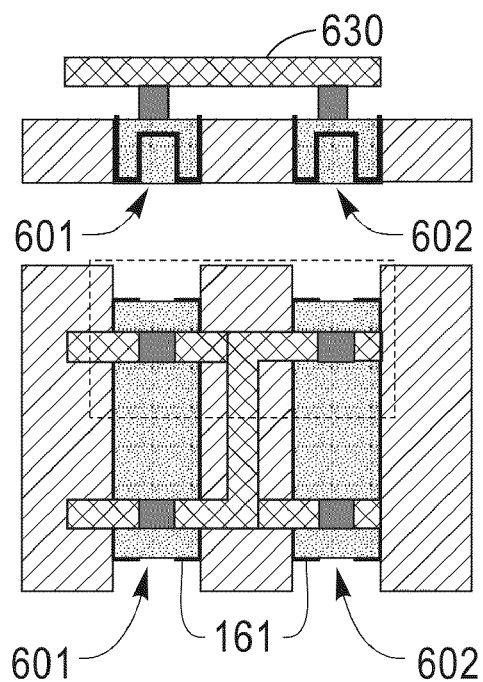
FIG. 16B
FIG. 16A
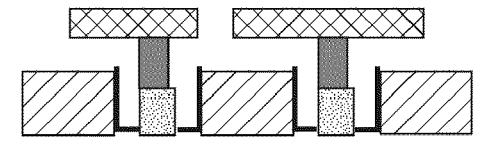
FIG. 17B
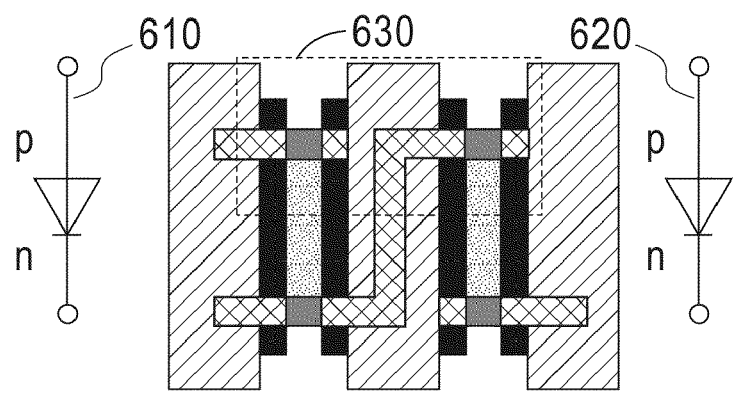
FIG. 17A

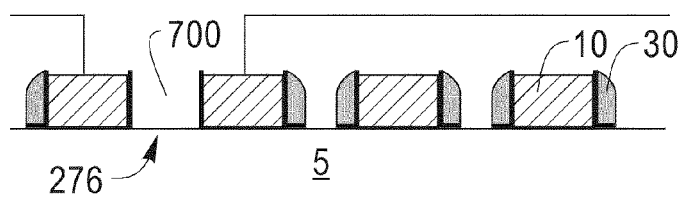
FIG. 18A
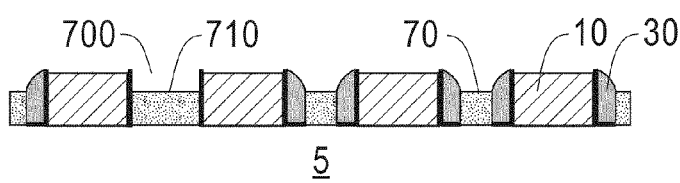
FIG. 18B
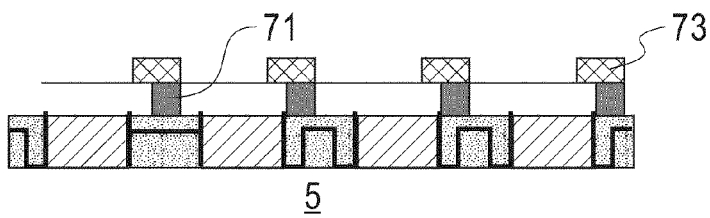
FIG. 18C
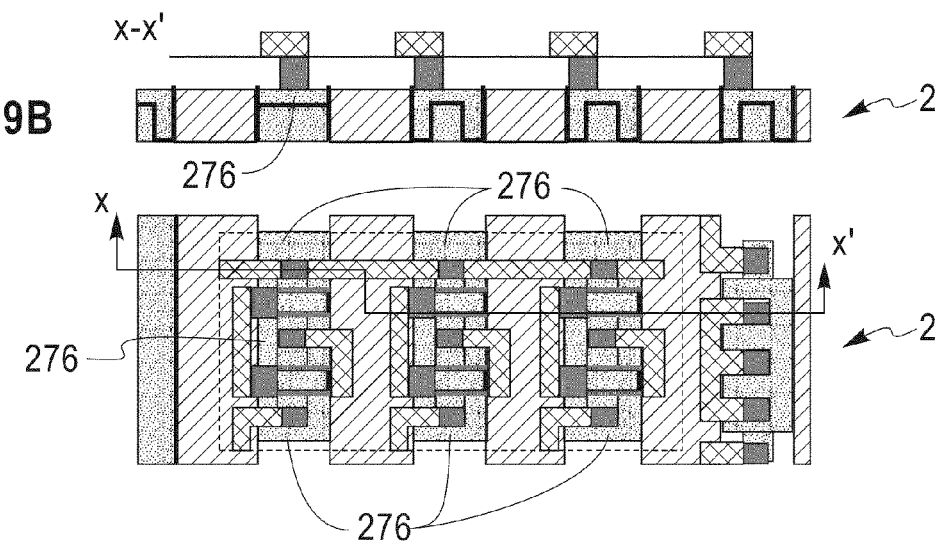
FIG. 19B
FIG. 19A

SEA-OF-FINS STRUCTURE ON A SEMICONDUCTOR SUBSTRATE AND METHOD OF FABRICATION

CROSS-REFERENCE TO RELATED APPLICATIONS

This application is a Continuation of U.S. application Ser. No. 11/185,646 filed Jul. 20, 2005, the complete disclosure of which, in its entirety, is herein incorporated by reference.

BACKGROUND OF THE INVENTION

1. Field of The Invention

The embodiments of the invention generally relate to integrated circuit technology, and, more particularly, to methods to form a customized field effect transistor (FET).

2. Description of The Related Art

Motivation to form FinFET devices on very thin silicon rail as the body of a metal oxide semiconductor field effect transistor (MOSFET) is driven by the need for shorter gate lengths, lower leakage currents, and a higher level of device integration. The lack of a reliable high-k gate stack to limit the leakage current makes the three-dimensional structure of thin body, known as a "fin" in U.S. Pat. No. 6,252,284, the complete disclosure of which is herein incorporated by reference, very attractive in 90-nanometer process node and beyond. The fin body is normally gated on three sides to gain better control of the channel potential, thus resulting in better short channel effect and scalability. Methods for forming such FinFET devices face significant challenges such as sub-lithographic dimension control of the fin width in a manufacturing environment, and surface planarity to facilitate back-end-of-line metallization. Although the fin dimensions in the conventional devices may be defined by any conventional lithographic methods, it is desirable to further reduce the fin dimension to less than 30 nm, which is beyond the capability of existing lithographic technology.

SUMMARY OF THE INVENTION

In view of the foregoing, an embodiment of the invention provides a method of fabricating a semiconductor device, wherein the method comprises forming a dielectric oxide layer on a substrate and etching the dielectric oxide layer to form a pattern of parallel oxide bars on the substrate; forming nitride spacers on each side wall of the parallel oxide bars, such that gaps remain between adjacent ones of the nitride spacers formed on side walls of adjacent ones of the parallel oxide bars; forming silicon pillars in the gaps; removing the nitride spacers by directional reactive ion etching, such that the silicon pillars form a plurality of planarized fin bodies, the plurality of planarized fin bodies being selectively apportioned between a first portion and a second portion of the plurality of planarized fin bodies; forming a fin field effect transistor (FinFET) from the first portion of the plurality of planarized fin bodies; forming a fin capacitor from selected ones of the second portion of the plurality of planarized fin bodies, the fin capacitor including a top electrode formed by a deposited conductor on a top surface of a planarized fin body of the selected ones the second portion of the plurality of planarized fin bodies; and forming a metal interconnect between the FinFET and the top electrode of the fin capacitor.

The method may further comprise exposing the first type of fin bodies by removing the gate conductor from the first type of fin bodies; and forming a region of semiconductor resistance in the exposed first type of fin bodies. Additionally, the method may further comprise doping a selective portion of the gate conductor to produce a region of semiconductor resistance in the gate conductor. Furthermore, the method may further comprise connecting a plurality of the fin capacitors in parallel using a first level of the metal interconnects. Moreover, the method may further comprise forming a plurality of diodes in the fin bodies; and connecting the diodes in series. Also, the method may further comprise selectively removing the nitride spacer in selected areas of the semiconductor device adapted to be formed into source/drain regions of the FinFET; and forming an epitaxial material in the selected areas. Preferably, the fabricated semiconductor device is adapted to be used in customized applications as a customized semiconductor device.

Another aspect of the invention provides a method of forming a semiconductor device to be used in very large scale integrated circuit (VLSI) applications, wherein the method comprises forming, on a substrate, an array of fin bodies comprising silicon and adapted to be used in customized fin field effect transistor (FinFET) construction; forming nitride spacers around each fin body in the array of fin bodies; separating each the fin body from one another; and applying a protective film over the array of separated fin bodies. The method may further comprise removing the protective film; forming FinFET devices from a first type of fin body; forming fin capacitors from a second type of fin body; and forming metal interconnects on the FinFET devices and the fin capacitors, wherein formation of each of the FinFET devices preferably comprises forming a gate conductor over the first type of fin body; forming a channel region below the gate conductor; and configuring source/drain regions adjacent to the channel region.

The method may further comprise exposing the first type of fin body by removing the gate conductor from the first type of fin body; and forming a region of semiconductor resistance in the exposed first type of fin body. Moreover, the method may further comprise doping a selective portion of the gate conductor to produce a region of semiconductor resistance in the gate conductor. Additionally, the method may further comprise connecting a plurality of the fin capacitors in parallel using a first level of the metal interconnects. Also, the method may further comprise forming a plurality of diodes in the fin body; and connecting the diodes in series. Furthermore, the method may further comprise selectively removing the nitride spacers in selected areas of the semiconductor device adapted to be formed into source/drain regions of the FinFET; and forming an epitaxial material in the selected areas. Preferably, the formed semiconductor device is adapted to be used in customized applications as a customized semiconductor device.

Another embodiment of the invention provides a semiconductor device adapted to be used in customized applications as a customized semiconductor device comprising a substrate; a plurality of planarized fin bodies on the substrate, wherein the fin bodies are adapted to be used for customized fin field effect transistor (FinFET) device formation; a nitride spacer around each of the plurality of fin bodies; an isolation region in between each of the fin bodies; and a protective film on the plurality of fin bodies, the nitride spacers, and the isolation regions, wherein the plurality of planarized fin bodies are preferably adapted to be used for any of customized fin resistor, customized fin capacitor, and customized diode device formation.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 1(A) through 3(B) illustrate schematic diagrams of successive steps of forming a sea-of-fins (SOF) substrate according to an embodiment of the invention;

FIGS. 4(A) through 17(B) illustrate schematic diagrams of successive steps of forming a FinFET device using the SOF substrate of FIG. 3(B) according to an embodiment of the invention;

FIGS. 18(A) through 19(B) illustrate schematic diagrams of successive steps of forming a FinFET device according to an alternate embodiment of the invention.

DETAILED DESCRIPTION OF PREFERRED EMBODIMENTS OF THE INVENTION

Figure 1A:
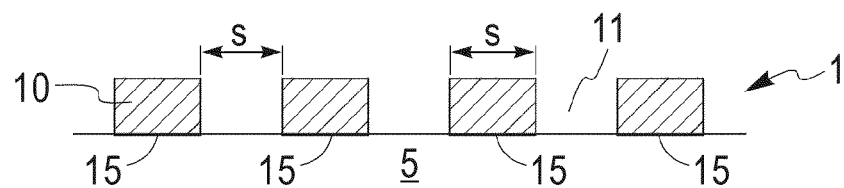

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, it is desirable to further reduce the fin dimension to less than 30 nm, which is beyond the capability of existing lithographic technology. The embodiments of the invention achieve this by providing a technique of forming a semiconductor substrate with a prefabricated sea-of-fins (SOF) structure and a technique to customize each SOF substrate and form a variety of microelectronic devices and integrated circuit chips using such a SOF substrate. Referring now to the drawings, and more particularly to FIGS. 1(A) through 20, where similar reference characters denote corresponding features consistently throughout the figures, there are shown preferred embodiments of the invention.

The embodiments of the invention utilize sub-lithographic patterning techniques including sidewall spacer image transfer or phase shift technology. According to the embodiments of the invention, one method to form fin patterns in the 30 nm range is to use the sidewall spacers. Since sidewall spacers are formed by depositing and etching a layer of dielectric material of uniform thickness, the dimension of the spacers can be controlled in the range of interest. Consequently, the dimensions of fins and isolation space can be precisely controlled as well. Formation of fin devices using sidewall spacer image transfer techniques include techniques taught in U.S. Pat. No. 6,794,718, the complete disclosure of which, in its entirety, is herein incorporated by reference, where fins with at least two crystalline orientations are formed.

Figure 1B:
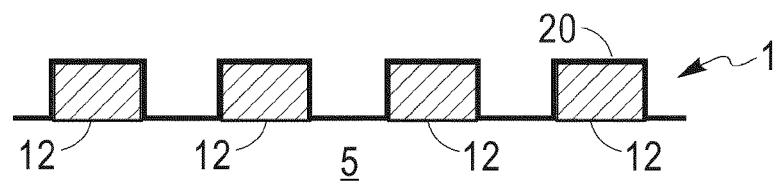
Figure 1C:
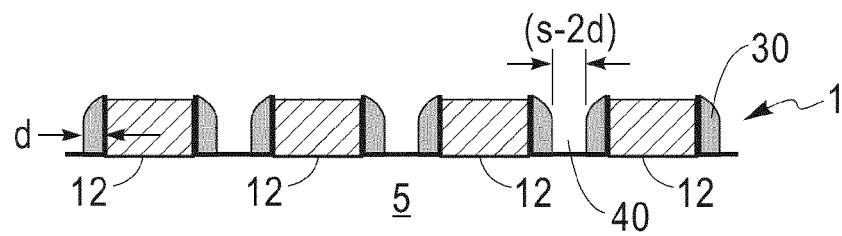

The following diagrams illustrate the processing steps to fabricate the sea-of-fins substrate. FIGS. 1(A) through 3(B) illustrate schematic diagrams of successive steps of forming a SOF substrate 1 according to an embodiment of the invention. As shown in FIG. 1(A), a layer of dielectric (oxide) material 10 on a silicon substrate 5 and an etching process is performed to form a line-space pattern 's' of the dielectric material 10. It is preferable to include a thin nitride etch stop barrier 15 under the mandrel oxide 10 to facilitate the safe removal of certain regions 11 of mandrel oxide 10 later in the process in order to gain access to the substrate 5. The line spacing 's' can be set to 120 nm, which is approximately equal to three times the dimension of the fin body. The thickness of the oxide material 10 is preferably in the range of 50 to 100 nm. Next, a thin layer of low-k dielectric material 20 is deposited on the surface of the etched oxide pattern 12 to lower the parasitic capacitance as indicated in FIG. 1(B). The thickness of low-k liner 20 is approximately 5 to 10 nm. As shown in FIG. 1(C), dielectric (nitride) spacers 30 are formed on the sidewalls of the isolation patterns 12 by first depositing the material with a thickness of 'd' (approximately 40 nm) followed by directional reactive ion etching. The resulting gap 40 between the two spacers 30 is equal to (s−2d), which is preferably in the range of 40 nm for the fin body structure.

Figure 2A:
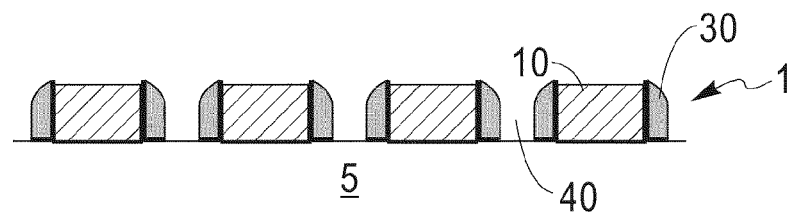
Figure 2B:
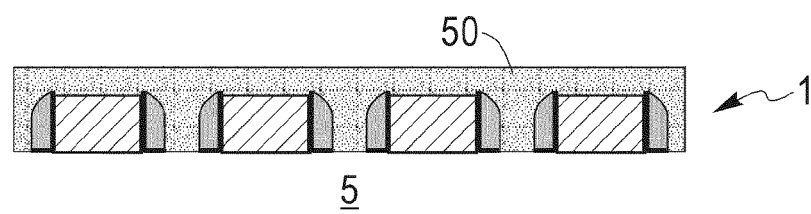
Figure 2C:
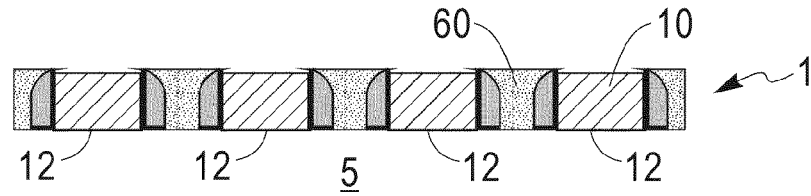

Next, the low-k film 20 is etched in the gap areas 40 to expose the silicon substrate 5 underneath as depicted in FIG. 2(A). Then, as indicated in FIG. 2(B), epitaxial silicon layer 50 is selectively grown from the silicon 5 at the bottom of the gaps 40, until the epitaxial silicon layer 50 fills the gaps 40 and covers the entire top surface of a SOF substrate 1. The epitaxial silicon layer 50 inside the gap 40 comprises single crystalline material. A chemical mechanical polishing (CMP) process is performed to remove the silicon on the top of the SOF substrate 1 until the oxide 10 of the isolation pattern 12 is exposed. A slight over-etch may be performed to ensure that the epitaxial silicon layer 50 is completely removed from the top surface of oxide 10, while single crystalline silicon remains inside the gap areas as provided in FIG. 2(C).

Then, a body of crystalline silicon 60 is recessed to a predetermined depth by a timed etching process such that silicon pillars (what shall eventually constitute the fin bodies) 70 formed inside the gaps 40 have identical heights after etching as illustrated in FIG. 3(A). Thereafter, the SOF substrate 1 is cleaned and coated with a protective film 80 as depicted in FIG. 3(B). Accordingly, the preparation of a SOF wafer 1 comprising a plurality of silicon pillars 70 and isolations 12 is complete and ready for device fabrication.

FIGS. 4(A) through 17(B) illustrate schematic diagrams of successive steps of forming a FinFET device using the SOF substrate 1 of FIG. 3(B). As indicated in the cross-sectional view of FIG. 4(A) and the top view of FIG. 4(B), the protective film 80 (of FIG. 3(B)) is removed. Next, the nitride spacers 30 on the sidewalls of the isolation regions 95 are removed as shown in FIGS. 5(A) through 5(C). A mask 90 is used to define a fin body region, 105, for a FET, and 106, for a capacitor. The X-X' cross-sectional view is shown in FIG. 5(C) and the top view is shown in FIG. 5(B). The length of each stripe of fin body, 105, for a FET, and 106, for a capacitor, is determined after silicon etching by Cl$_2$ plasma. The oxide isolation region 12 between adjacent body units 105 is used to isolate the devices and support the metal interconnects, which are formed in subsequent processing steps. The body regions 105 in FIGS. 5(A) through 5(C) are used to form FinFETs and the body region 106 in FIGS. 5(A) and 5(C) is used to form fin capacitors. A second mask 91 is then used to define the well regions of the device as indicated in FIGS. 6(A) through 6(C). After an ion implant process occurs (as depicted by the downward arrows in FIG. 6(C)), the well junction 130 is formed.

In the next step of the process, a gate dielectric 145 is formed via thermal oxidation of a high-k film deposition as shown in FIG. 7(A). Here, a polysilicon layer 140 is deposited via chemical vapor deposition (CVD). Next, excessive polysilicon material 140 on the surface of the SOF substrate 1 is removed with a second CMP process. The reserved spacer areas 150 are now filled with polysilicon as shown in FIG. 7(B). Then, as illustrated in FIGS. 8(A) through 8(C), the gate is defined with a third mask 170, where region 170A is used to form the fin gates of the transistors and region 170B is used for the top electrode of a capacitor. As shown in FIGS. 9(A) through 9(C), the next steps involve performing an etch process that removes CVD polysilicon with Cl.sub.2 plasma to define the gate electrodes 220 and the top capacitor electrode 230.

After gate patterning, the process involves selectively removing the high-k dielectric 145 from the fin sidewalls in non-gate areas 240 as indicated in FIGS. 10(A) through 10(C). Then, the exposed sidewalls of the fins 105 are doped with an appropriate n+ or p+ dopant to form the source and drain junctions on the exposed body regions 250 as indicated in FIGS. 11(A) through 11(C). The channels (not shown) of the FinFETs 111 are protected from being contaminated by the source/drain doping by the overlying gate conductor 220, and the junction edge is aligned to the gate edge. It is preferable to use a plasma immersion implant tool for gas phase doping or a high angle single wafer implanter for angled ion implantation. Halo doping, if desired, could be introduced by angled ion implantation, and conformal doping schemes such as solid phase doping are also acceptable.

Next, a thin layer of dielectric 210 is deposited and a reactive ion etching process is used to form the sidewall spacers 210 for the gate, source, drain, and oxide area of the device as illustrated in FIGS. 12(A) through 12(C). Next, as shown in FIGS. 13(A) through 13(C), metal interconnects 280, connected to a FinFET, and 285, connected to the capacitor, are formed via back-end-of-line processes that include insulating material deposition, planarization, via formation, and metal deposition. For example, CVD tungsten stud 234, connected to a FinFET, and 235, connected to a capacitor, in FIGS. 13(A) through 13(C) are used to connect aluminum or copper wires 260 with the gates 220, as well as the bodies in the source/drain areas 233. With the dimension of the metal interconnects 280, connected to a FinFET, and 285, connected to a capacitor, in the range of 40 nm, fin-transistor devices 151 are shown in the left portions of FIGS. 13(A) and 13(C) and fin capacitor devices 161 are shown on the right portions of FIGS. 13(A) and 13(C).

FIGS. 14(A) and 14(B) show the implementation of a two-stage inverter chain 400, with a first inverter 401, comprising the first pMOS device p1 and the first nMOS device n1, and a second inverter 403, comprising the second pMOS device p2 and the second nMOS device n2 according to the embodiments of the invention. The width of p2 and n2 can be doubled by connecting p2 with p3 in parallel, and connecting n2 with n3 in parallel. Multiple gates with different sizes can therefore be easily implemented and customized on the sea-of-fins substrate 1 provided by the embodiments of the invention.

FIGS. 15(A) and 15(B) illustrate two embodiments of fin resistors according to the embodiments of the invention. A first resistor 510 is formed by the body of the FinFET 151. During gate conductor patterning, the gate conductor is removed from the region where a resistor is desired. Then, appropriate gas phase doping or ion implantation is introduced into the exposed fin to obtain the desired resistance. The contacts 509, which are similar to the source and drain contacts, are made on the opposite ends of the fin structure. A second resistor 520 is formed from the gate conductor material such as polysilicon. To achieve the desired resistance, the area of gate conductor that will contain the resistor 520 should be blocked from gate doping. A separate mask (not shown) and doping process is then used to introduce the appropriate amount of dopant into the gate conductor to achieve the desired resistance. This separate doping step may be done before or after the standard gating doping process.

FIGS. 16(A) and 16(B) illustrate the structure of two fin capacitors 601, 602 connected in parallel by a first level metallization 603. The fin capacitors 601, 602 generally comprise a large area of the fin body 161 or multiple fin bodies to provide sufficient capacitance. For enhanced capacitance, the fin capacitors 601, 602 may include adjacent source or drain diffusions to provide carriers for the formation of inversion layers (not shown). FIGS. 17(A) and 17(B) depict the structure of electrostatic discharge (ESD) protection devices 610, 620. Two diodes 610 and 620 are formed in the fin bodies and connected in series. The diodes 610, 620 may provide a lateral or a combined lateral/vertical doping profile, which could be introduced after the removal of gate conductor from the region where the diodes 610, 620 are to be formed. To protect a device (not shown) from excessive voltage with positive or negative polarity, the device (not shown) should be connected to the junction of the two diodes 610, 620.

FIGS. 18(A) through 18(C) illustrate a process to reduce the source and drain contact resistance in a FinFET device. According to FIG. 18(A), the nitride spacers 30 are selectively removed in the source/drain areas 276 during SOF substrate preparation. Next, epitaxy 710 is grown to fill the gaps 700 (FIG. 18(B)). Due to the removal of the sidewall spacers 30, the widened source/drain areas 276 are approximately three times as wide as the fin body area (which will constitute the gate) 70. Next, the source/drain regions 276 are interconnected by vias 71 and metal interconnects 73 during a back end-of-the line (BEOL) process thereby providing larger contact area and lower contact resistance as illustrated in FIG. 18(C). FIGS. 19(A) and 19(B) show the top and cross-sectional views, respectively, of a modified sea-of-fins structure 2 with widened source/drain regions 276.

The sea-of-fins (SOF) substrate 1, 2 provided by the embodiments of the invention can be prefabricated and mass-produced by the wafer suppliers. The dimension of fin bodies 105, 106 can also be custom-designed and produced by the chip manufacturers. Since many of the SOF processing steps provided by the embodiments of the invention are self-aligned and the finished FinFET devices have a coplanar structure for both the gate regions 220 and the adjacent isolation regions 12, it is possible to achieve further device scaling beyond the 30 nm range.

Figure 20:
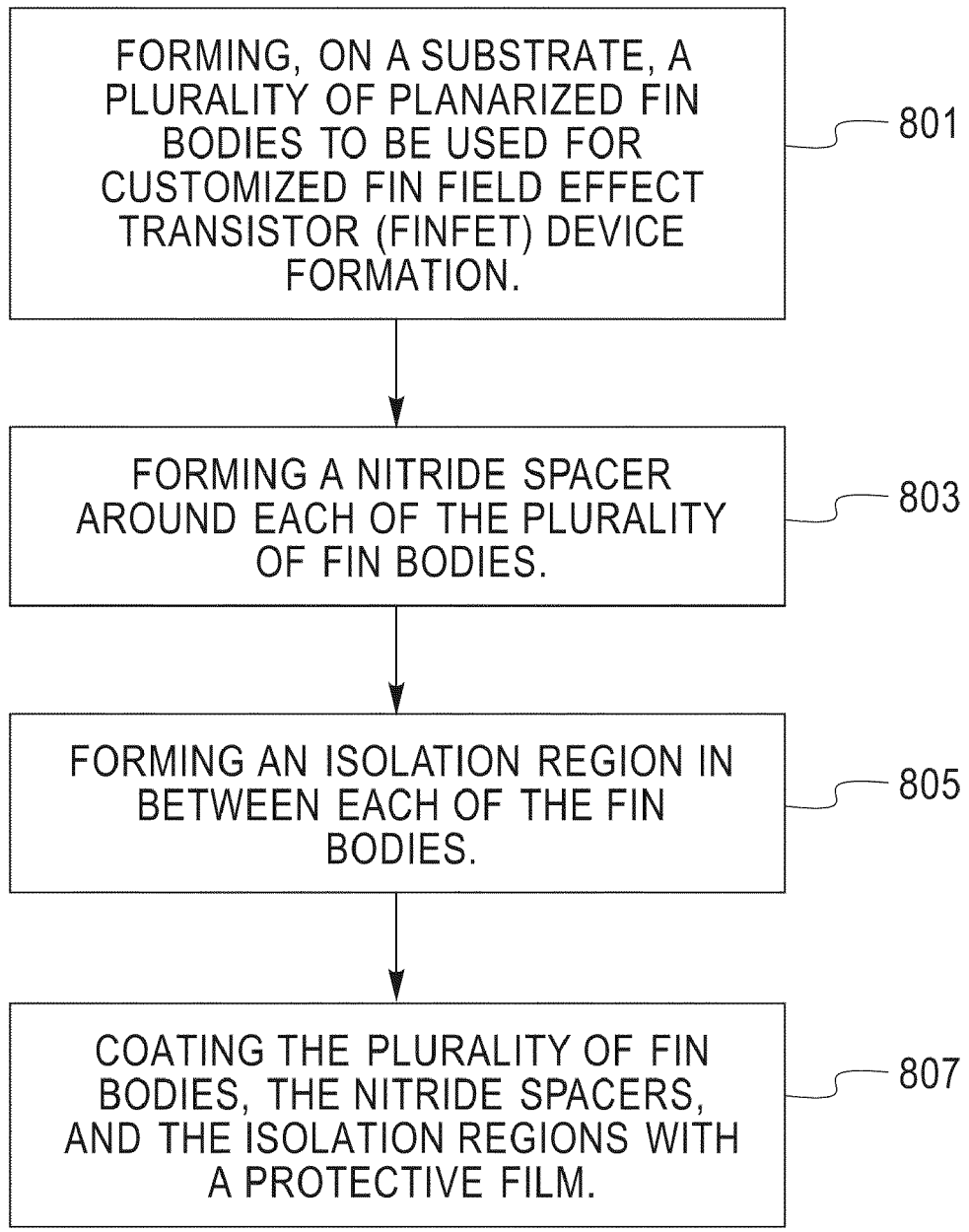
FIG. 20 is a flow diagram illustrating a preferred method according to an embodiment of the invention.

FIG. 20, with reference to FIGS. 1(A) through 19(B), illustrates a flow diagram of a method of fabricating a semiconductor device, wherein the method comprises forming (801), on a substrate 5, a plurality of planarized fin bodies 70 to be used for customized fin field effect transistor (FinFET) device formation; forming (803) a nitride spacer 30 around each of the plurality of fin bodies 70; forming (805) an isolation region 12 in between each of the fin bodies 70; and coating (807) the plurality of fin bodies 70, the nitride spacers 30, and the isolation regions 12 with a protective film 80.

The several embodiments of the invention can be formed into integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Generally, the embodiments of the invention provide a method of fabricating SOF substrates consistent with high-volume, high-yield, and low-cost semiconductor manufacturing. Moreover, the embodiments of the invention provide a technique of how the SOF substrates are used to design and fabricate high-performance integrated circuits.

Wafer substrates with pre-fabricated fin structures allow chip manufacturers achieve better control of the fin dimensions in the 30 nm range. However, an array of fins 105, 106 and isolation spaces 12 prepared on a semiconductor substrate 5 prior to shipping to a semiconductor foundry has never heretofore been demonstrated prior to the techniques provided by the embodiments of the invention. Due to the economies of scale, substrate providers can supply such pre-fabricated SOF substrates 1, 2 at a lower cost. Such prefabricated SOF substrates 1, 2 would also be highly marketable because chip manufacturers would no longer have to contend with the technical and economic difficulties of producing well-controlled sub-lithographic-width fins within their own processes.

The foregoing description of the specific embodiments will so fully reveal the general nature of the embodiments of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention has been described in terms of preferred embodiments, those skilled in the art will recognize that the embodiments of the invention can be practiced with modification within the spirit and scope of the appended claims.

What is claimed is:

1. A method of forming a semiconductor device to be used in very large scale integrated circuit (VLSI) applications, said method comprising:
    forming a dielectric oxide layer on a substrate and etching said dielectric oxide layer to form a pattern of parallel oxide isolations on said substrate;
    forming nitride spacers on each side wall of said parallel oxide isolations, such that gaps remain between adjacent ones of said nitride spacers formed on side walls of adjacent ones of said parallel oxide isolations;
    forming silicon pillars in said gaps;
    removing said nitride spacers by directional reactive ion etching, such that said silicon pillars form a plurality of planarized fin bodies, said plurality of planarized fin bodies being selectively apportioned between a first portion and a second portion of said plurality of planarized fin bodies;
    forming a fin field effect transistor (FinFET) from said first portion of said plurality of planarized fin bodies;
    forming a fin capacitor from selected ones of said second portion of said plurality of planarized fin bodies, said fin capacitor including a top electrode formed by a deposited conductor on a top surface of a planarized fin body of said selected ones said second portion of said plurality of planarized fin bodies; and
    forming a metal interconnect between said FinFET and said top electrode of said fin capacitor.

2. The method of claim 1, further comprising:
    selectively removing selected ones of said nitride spacers in selected areas of said semiconductor device adapted to be formed into source/drain regions of said FinFET.

3. The method of claim 1, wherein the formed semiconductor device is adapted to be used in customized applications as a customized semiconductor device.

4. The method of claim 1, wherein said forming said FinFET comprises:
    forming a gate conductor over selected ones of said first portion of said plurality of planarized fin bodies;
    forming a channel region below said gate conductor; and
    configuring source/drain regions adjacent to said channel region;
    exposing fin sidewalls in non-gate areas of said selected ones of said first portion of said plurality of planarized fin bodies; and
    doping said exposed fin sidewalls in non-gate areas of said selected ones of said first portion of said plurality of planarized fin bodies to form source/drain junctions.

* * * * *